(12) United States Patent
Arcand et al.

(10) Patent No.: US 7,054,881 B2
(45) Date of Patent: May 30, 2006

(54) METHOD AND SYSTEM FOR REPORTING STANDARDIZED AND VERIFIED DATA

(75) Inventors: Jean-Francois Arcand, Prevost (CA); Deepa Singh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 536 days.

(21) Appl. No.: 10/322,392

(22) Filed: Dec. 17, 2002

(65) Prior Publication Data

US 2004/0153822 A1  Aug. 5, 2004

(51) Int. Cl.
*G06F 17/30* (2006.01)
(52) U.S. Cl. ...................... 707/102; 707/101
(58) Field of Classification Search ............ 707/1, 707/10, 102, 104.1, 101; 705/10, 35, 54, 705/64; 709/219, 225; 714/4, 30, 38, 42; 717/124
See application file for complete search history.

(56) References Cited

U.S. PATENT DOCUMENTS

2003/0204784 A1* 10/2003 Jorapur ................... 714/38

OTHER PUBLICATIONS

Masuishi et al, A Reporting Tool Using "Programming by Example" For Format Designation, 2000, ACM, pp. 177-180.*
McGregor et al., Selecting test cases Based on User Priorities, Mar. 2000, Software Development Magazine, pp. 1-7.*

* cited by examiner

*Primary Examiner*—Apu M. Mofiz
(74) *Attorney, Agent, or Firm*—Martine Penilla & Gencarella LLP

(57) ABSTRACT

A system for generating profiled test execution data using a plurality of test suite output files is provided. The system includes a plurality of test suites and a report tool engine. The plurality of test suites is executed creating a plurality of respective test suite output files. The report tool engine is configured to automatically transform each of the plurality of test suite output files to a standardized test execution results file. Each standardized test execution results file has an identical file format. The report tool engine is further configured to profile each of the standardized test execution results file in accordance with a user profile setting, generating a profiled data file.

20 Claims, 15 Drawing Sheets

500f

SQE Report Tool Portal Information
Summary Result

| Date | Product Version | Build Type | Database | Driver | JDK Version | OS | Pass | Fail | Expected Run | Url |
|---|---|---|---|---|---|---|---|---|---|---|
| 010927 | 1.3.1 | promoted | cloudscape | cloudscapeXA | 1.3.1 | Solaris 7 | 4 | 6 | 12 | View |
| 010928 | 1.3.1 | nightly | oracle | oracle8i | 1.3.1 | win2k | 6 | 5 | 12 | View |

Cloudscape_cloudscapeXA_Solaris 7 Results

| Test Suite Name | Pass | Fail | Expected Pass |
|---|---|---|---|
| cmpToCmp | 2 | 3 | 6 |
| runAsJSP | 2 | 3 | 6 |

Oracle_oracle8i_win2k Results

| Test Suite Name | Pass | Fail | Expected Pass |
|---|---|---|---|
| runAsDeletion | 1 | 5 | 6 |
| EJBOL | 5 | 0 | 6 |

FIG. 5F

METHOD AND SYSTEM FOR REPORTING STANDARDIZED AND VERIFIED DATA

BACKGROUND OF THE INVENTION

1. Field of the Invention

The present invention relates generally to software testing, and more particularly, to methods and systems for simplifying test execution report generation.

2. Description of the Related Art

As the use of computer software in performing daily tasks is increasing rapidly, assessing software reliability through software testing has become an imperative stage in the software development cycle. As is well known, software testing is directed toward eliminating defects (i.e., bugs) in computer software, which if undetected, can create significant negative results.

Typically, computer software development involves multiple groups of developers and engineers, with the members of each group being responsible for developing a certain portion of the computer software source code (i.e., workspace). Members of each group are further responsible for ensuring that the group workspace functions properly, which for the most part, is achieved through testing the workspace of the group. Usually, by the conclusion of testing process, workspace testing results in the generation of multiple reports, each containing test execution results.

Testing workspaces by different groups of developers has several disadvantages. First, test result execution reports created by different groups of engineers usually have dissimilar formats due to the members of the groups having full discretion as to the format of the test execution results. For instance, while one software quality engineer of a group may prefer generating a test execution result having a text file format, a software quality engineer of a different group may prefer to store the test execution results in a database. In either scenario, to generate a report, the user is required to manually review each test execution result file or database so as to retrieve the required information of the user. Furthermore, generating a comprehensive test execution result report from each and every generated test execution result report is a very time consuming, exhausting, and costly task, unnecessarily wasting resources while reducing productivity.

Second, in addition to having different test execution result formats, typically different test execution results may associate dissimilar context to what constitutes passing or failing of a test. For instance, different test harnesses associate different contexts to what constitutes passing or failing of a test case in the particular test harness.

Third, irrespective of having dissimilar formats or having different contexts as to passing or failing of a test, unverified test execution results are generated. That is, one viewing the test execution results cannot determine whether certain failure of a test is due to a bug in the software being tested or other problems such as the network being down. Thus far, one way to generate unverified data is to have each quality software engineer to manually review and verify each of the respective test execution results. As can be appreciated, this task is also extremely lengthy, and exhaustive, and expensive.

In view of the foregoing, there is a need for a flexible methodology and system for maintaining high-quality test execution results while simplifying generation of verified test execution reports.

SUMMARY OF THE INVENTION

Broadly speaking, the present invention fills these needs by storing and maintaining high-quality standardized test execution results while simplifying generation of verified test execution reports adapted to satisfy a specific requirements of the user. In one embodiment, a report tool is implemented to automatically standardize test execution results and store the uniform test execution results in storage. In one implementation, the report tool allows the specific user to view verified data accessible by the specific user customized based on the specific requirements of the user. It should be appreciated that the present invention can be implemented in numerous ways, including as a process, an apparatus, a system, a device, or a method. Several inventive embodiments of the present invention are described below.

In one embodiment, a system for generating profiled test execution data using a plurality of test suite output files is provided. The system includes a plurality of test suites and a report tool engine. The plurality of test suites is configured to be executed so as to create a plurality of respective test suite output files. The report tool engine is configured to automatically transform each of the plurality of test suite output files to a standardized test execution results file. Each standardized test execution results file has an identical file format. The report tool engine is further configured to profile each of the standardized test execution results file in accordance with a user profile setting, generating a profiled data file.

In another embodiment, a computer program embodied on a computer readable medium for automatically standardizing test suite output files to be implemented to generate verified profiled test execution result files is provided. The computer program includes program instructions for automatically transforming each test suite output file to a single format. The computer program further includes program instructions for using the test suite output files in the single format to generate profiled test execution result files. Also included in the computer program are computer instructions for storing the profiled test execution result files. The computer program also includes program instructions for enabling users to access the profiled test execution result files. Each user receives the profiled test execution result files in a predefined user specific format.

In yet another embodiment, a method for automatically generating standardized test execution results to be used to generate validated profiled test execution results is provided. The method includes obtaining a plurality of test suite output files having similar or dissimilar types. The method also includes transforming each of the output files to standardized output files, if needed. The standardized output files are configured to have a single format. The method further includes storing the standardized output files to a first storage. The method also includes creating user profiled test execution results for each user utilizing the standardized output files that define requirements of each user. Further included in the method is storing the profiled test execution results to a second storage.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 5A–5F depict a plurality of exemplary report tool graphical user interfaces (GUI), in accordance with yet another embodiment of the present invention.

DETAILED DESCRIPTION OF THE PREFERRED EMBODIMENTS

Figure 1A:
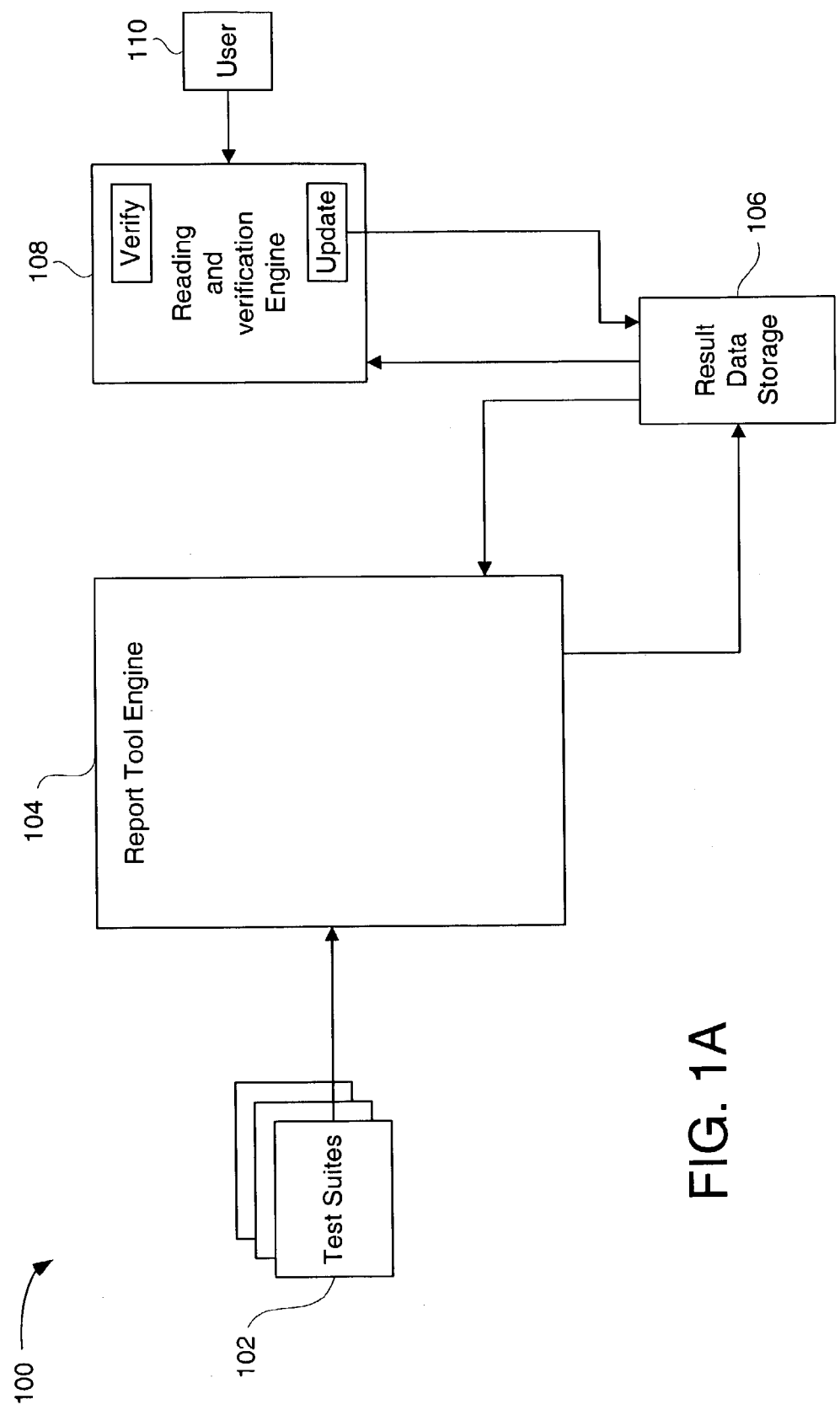
FIG. 1A is a simplified schematic diagram of an exemplary a reporter tool, in accordance with one embodiment of the present invention.

Inventions for storing and maintaining high-quality standardized test execution results while simplifying generation of verified test execution reports adapted to satisfy specific requirements of the user, are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In one embodiment, a report tool is implemented to automatically standardize test execution results and to store the uniform test execution results in storage. In one implementation, the report tool enables the specific user to view verified and standardized data accessible by the specific user and customized based on the specific requirements of the user. By way of example, the test execution outputs of a plurality of test suites are stored to a persistent result data storage using a report tool engine. In one implementation, the report tool engine has a reader adapter layer, a core layer, and a query layer. In one instance, the test execution outputs are fed to the reader adapters in the reader adapter layer, which are subsequently stored to an XML data storage component in a standardized format (e.g., single format). The data in the XML data storage component in conjunction with the user profile components provide profiled test execution data to be stored to a result data storage using writer adapters.

As embodiments of the present invention implement the Enterprise JavaBeans (EJB) application, a brief introduction to EJB architecture is provided below. EJB is part of a larger overall technology known as the Java 2 Platform, Enterprise Edition (J2EE) developed by Sun Microsystems, Inc. J2EE provides architecture for developing, deploying, and executing applications in a distributed-object environment.

Summarily, EJB architecture promotes the creation of re-usable server-side behaviors or instructions in the Java language, connectors to enable access to existing enterprise systems, and easy-to-deploy program modules. The EJB architecture creates a collaborative architecture to provide services virtually anywhere, and for a wide range of customers and devices.

The EJB architecture defines a model for the development and deployment of reusable Java server components called EJB components (i.e., EJB beans). As designed, the EJB component is a non-visible server component having methods that provide business logic in a distributed application. In one example, the EJB architecture includes the EJB client and the EJB server. The EJB client is configured to provide the user-interface logic on a client machine and to make calls to remote EJB components on a server. For instance, the EJB client is provided the information as to how to find the EJB server and how to interact with the EJB components.

In one example, the EJB client does not communicate directly with the EJB component. In one aspect, the EJB container provides the client proxy objects that implement the home and remote interfaces of the component. In one example, the remote interface is configured to define the business methods that can be called by the client. In another embodiment, the client is configured to invoke the methods resulting in the updating of the database. Thus, the EJB beans are reusable components that can be accessed by client programs. The application programmer codes the business logic into the EJBs and deploys them into a J2EE compliant server. In one example, the server complying with the J2EE specification provides the required system-level services, thus allowing the application programmer to concentrate on business logic.

The EJB server (i.e., the EJB application) includes an EJB container, which in one example provides the services required by the EJB component. For instance, the EJB container may be configured to include one of an EJB home interface or EJB Remote interface and EJB beans. In one embodiment, the EJB home interface and the EJB remote interface are defined in the same Java virtual machine. In a different embodiment, the EJB home interface and the EJB remote interface may be defined on different Java virtual machines or separate physical computers.

In one example, the EJB specification defines a container as the environment in which one or more EJB components execute. In accordance to one example, the EJB container provides the infrastructure required to run distributed components thus allowing the clients and component developers to focus on programming business logic. Simply stated, the container manages the low-level communications between the clients and the EJB beans. In one example, once an EJB bean is created by a client, the client invokes methods on the EJB bean as if the EJB bean were running in the same virtual machine as the client.

Furthermore, the clients are unaware of activities on the EJB bean, since the container is configured to sit between the clients and the EJB beans. For instance, if an EJB bean is passivated, its remote reference on the client remains intact. Thus, when the client later invokes a method on the remote reference, the container activates the EJB bean to service the request.

The EJB container encapsulates:

The client runtime and generated sub classes. In one example, this allows the client to execute components on a remote server as if the components were local objects.

The naming service allows the clients to instantiate components by name. It further allows components to obtain resources (e.g., database connections, etc.) by name.

The EJB server component dispatcher, which in one example, executes the implementation class of the component and provides services such as transaction management, database connection pooling, and instance lifecycle management.

In one example, three types of EJB components can be enumerated.

Stateful session Beans: A stateful session bean manages complex processes or tasks that require the accumulation of data. They further manage tasks that require more than one method call to complete but are relatively short lived, store session state information in class instance data, and have an affinity between each instance and one client from the time the client creates the instance until it is destroyed by the client or by the server.

Stateless session Beans: A stateless session bean manages tasks that do not require the keeping of client session data between method calls. Furthermore, the method invocation by a stateless session bean does not depend on data stored by previous method invocations, there is no affinity between a component instance and a particular client, and different instances of the stateless session beans are seemed identical to the client.

Entity Beans: An entity bean model is a business model that is a real-world object which methods are run on the server machine. When the entity bean method is called, the thread of the program stops executing and control is passed to the server. When the method returns from the server, the local thread resumes executing. In one example, the entity beans have the following characteristics: Each instance represents a row in a persistent database relation (e.g., a table, view, etc.); and The bean has a primary key that corresponds to the key of database relation, which is represented by a Java data type or class.

Each EJB component further has a transaction attribute configured to determine the manner the instances of the component participate in transactions. As designed, the EJB container provides services which can include transaction and persistence support to the EJB components. As to the transaction support, the EJB container is configured to support transactions. In one example, when the bean is deployed, the EJB container provides the necessary transaction support. In regard to the persistence support, the EJB container is configured to provide support for persistence of the EJB components, which in one embodiment, is defined as the capability of the EJB component to save and retrieve its state. In this manner, the EJB component does not have to be re-created with each use.

In one example, the EJB architecture is a three-tiered architecture in which the clients reside on the first tier, the application server and the components (i.e., EJB beans) reside on the second tier, and the databases reside on the same host as the EJB server. In accordance to one implementation, the EJB server executes methods on a component from the client or another component, retrieves data from databases, and performs other communications. The EJB server further handles the details of transactions, threads, security, database connections, and network communication. Summarily, the EJB clients request business-logic services from EJB beans running on the second-tier. The EJB beans then use the system services provided by the second-tier server to access data from existing systems in the third tier. The EJB beans apply the business rules to the data, and return the results to the clients in the first-tier.

In one example, the client contains the user interface. The business logic is configured to be separate from both the clients and the databases and resides in the same tier (i.e., second tier) as components that analyze data, perform computations, or retrieve information from data sources and processes.

As EJB implements the Java™ (hereinafter "Java") programming language, in a like manner, an overview of Java is provided below. In operation, a user of a typical Java based system interacts with an application layer of a system generally written by a third party developer. The application layer generally provides the user interface for the system. A Java module is used to process commands received by the application layer. A Java virtual machine is used as an interpreter to provide portability to Java applications. In general, developers design Java applications as hardware independent software modules, which are executed Java virtual machines. The Java virtual machine layer is developed to operate in conjunction with the native operating system of a particular hardware, which represents the physical hardware on which the system operates or runs. In this manner, Java applications can be ported from one hardware device to another without requiring updating of the application code.

Unlike most programming languages, in which a program is compiled into machine-dependent, executable program code, Java classes are compiled into machine independent byte code class files which are executed by a machine-dependent virtual machine. The virtual machine provides a level of abstraction between the machine independence of the byte code classes and the machine-dependent instruction set of the underlying computer hardware. A class loader is responsible for loading the byte code class files as needed, and an interpreter or just-in-time compiler provides for the transformation of byte codes into machine code.

More specifically, Java is a programming language designed to generate applications that can run on all hardware platforms, small, medium and large, without modification. Developed by Sun, Java has been promoted and geared heavily for the Web, both for public Web sites and Intranets. Generally, Java programs can be called from within HTML documents or launched standalone. When a Java program runs from a Web page, it is called a "Java applet," and when run on a Web server, the application is called a "servlet."

Java is an interpreted language. The source code of a Java program is compiled into an intermediate language called "byte code". The byte code is then converted (interpreted) into machine code at runtime. Upon finding a Java applet, the Web browser invokes a Java interpreter (Java Virtual Machine), which translates the byte code into machine code and runs it. Thus, Java programs are not dependent on any specific hardware and will run in any computer with the Java Virtual Machine software. On the server side, Java programs can also be compiled into machine language for faster performance. However a compiled Java program loses hardware independence as a result.

Keeping this brief overview to Enterprise Java Beans and Java in mind, reference is made to a block diagram of FIG. 1A illustrating a reporter tool 100 in which a user 110 is shown to be interfacing with a report tool engine 104, in accordance with one embodiment of the present invention. As shown, test execution outputs of a plurality of test suites 102 are fed the report tool engine 104. Thereafter, profiled test execution data generated by the report tool engine 104 is stored in a result data storage 106.

In one example, the user 110 implements a reading and verification engine 108 to obtain standardized test execution reports using the profiled test execution data stored to the result data storage 106. In another example, the user 110 accesses the profiled test execution data by signing on to the report tool 100 using the user 110 name and password. Once the user 110 has signed up with the report tool 100, the user 110 is provided with the test execution results of the user. At this point, the user 110 can review the test execution results so as to determine whether a certain test execution results can be released. In one example, upon verification a certain test execution result, the profiled test execution data stored to the result data storage 106 is updated which, as will be described in more detail below with respect to FIG. 1B, in turn updates the test execution results stored in the report tool engine 104.

In one exemplary embodiment, the requirements below are the report tool 100 is designed such that the report tool 100 satisfies the requirements described below:

Ability to create test execution results having the same format for test execution result reporting;

Ability to view current test results and test results as generated over time.

Ability to customize the type of test data reported.

Ability to specify the medium used for displaying test data.

Ability to read test data into standard Report Tools such as Crystal Report, Formula One, etc.

Ability to automatically email the requested test reports to user.

Ability to modify/add/delete test data (in one example, used to filter non-product bugs) and add comments prior to generating reports.

Ability to redirect test results to another team member. In one example, this is beneficial as when one of the members of the group is out of the office, another member can review and verify the test results and to evaluate the bugs, if any.

Ability to query test/test suite archive.

Ability to create a link between substantially all of the generated reports to BugTraq.

The ability to run the tests without incorporating the test in the report process after a new test is register. In this manner, beneficially, the test bugs, if any, can be fixed before reporting product bugs.

Ability to read the J2EE Application Model defined in J2EE 1.3 specifications as well as the actual J2EE Blueprints documentation.

Ability to generate a report before substantially all the bugs are verified (i.e., as early as possible).

Ability to generate reports wherein one axis for generating the report is the platform where the test has been executed.

Ability to select the detail level of failure and generate a wide spectrum of reports ranging from summary reports to very detailed reports.

Ability to generate a report based on a specific time frame. In one example, one axis can be failure and the other time. The report can be generated as a bar chart, a strip chart, a table, etc.

The ability to include a table where the rows represent test suites and the columns represent the different test configurations. In one example, a table having such characteristics can be primarily implemented by the quality engineers.

The Ability to create information (e.g., critical information). In one example, critical information can be created by:

Using the actual statusU tool;

Using the Test Description JSP.

The ability to implement a simple database table structure. In one example, complex join may be avoided so as to speed the report generation.

The ability to hide certain information from third party vendors, such as user password, user profile, etc.

The ability to implement interface. For instance, the first version of the report tool can use JSP to generate GUIs. In one instance, applet and application can be added if required. For example, BugTraq has an HTML interface as well as a GUI (application) interface.

The ability to store user profile using XML. In this manner, the user can be allowed to change the profile of the user by editing the XML file of the user.

Figure 1B:
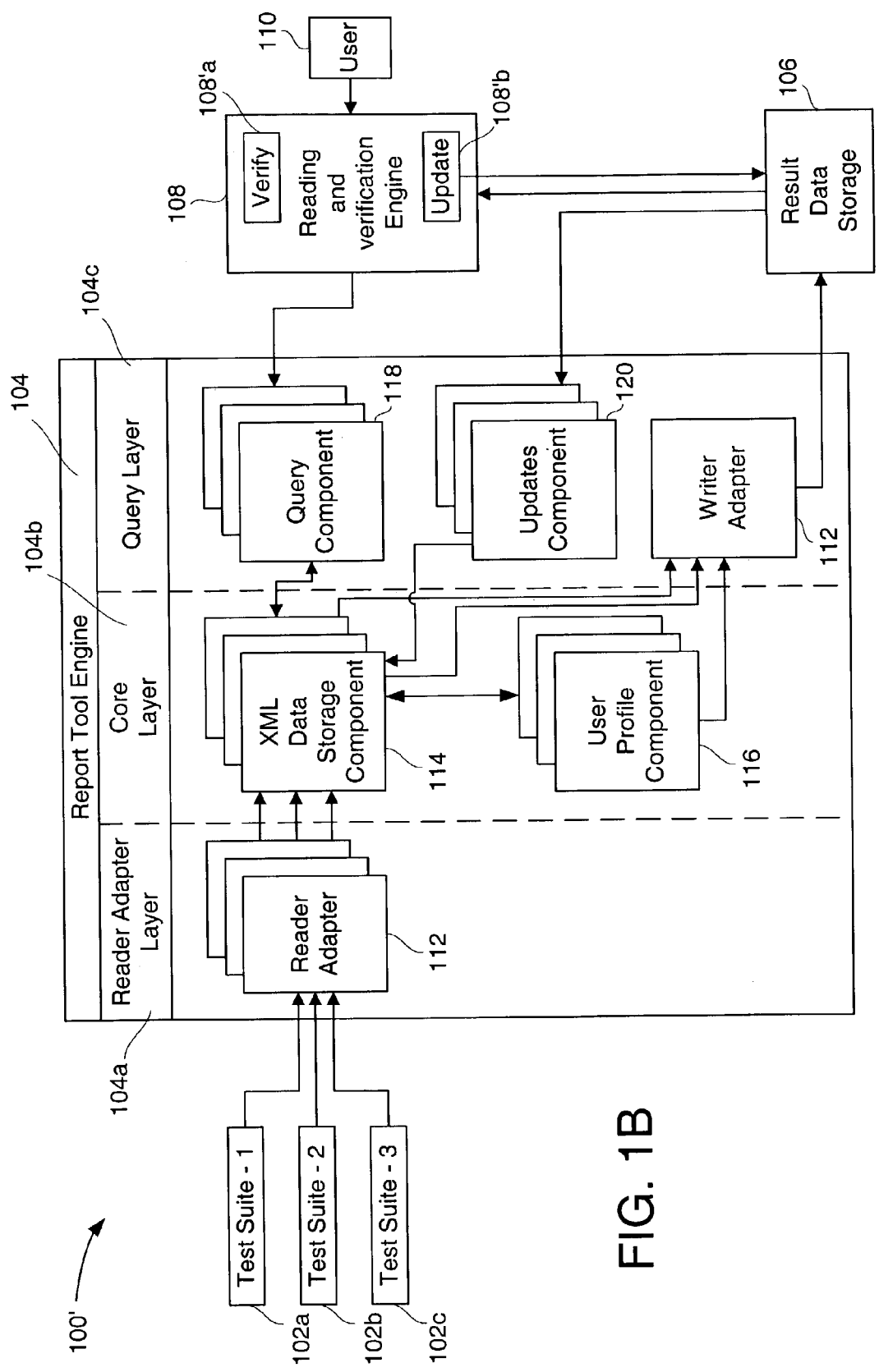
FIG. 1B is a simplified schematic diagram of a user communicating with an exemplary report tool, in accordance with one embodiment of the present invention.

FIG. 1B is a simplified block diagram illustrating the user 110 in communication with an exemplary report tool 100', in accordance with one embodiment of the present invention. As can be seen, test execution outputs generated by a plurality of test suites 102a–102c are fed into the report tool engine 104, which in turn produces the profiled test execution data, stored to the result data storage 106. The user 110 obtains the results of the test execution of the user by reading the profiled test execution data. As will be discussed in more detail below with respect to FIG. 3, each of the generated test execution outputs may have a different file format. Each of the generated test execution outputs can be converted to standardized test execution outputs. For instance, test suites having test execution outputs in the format of a file or a database can be converted to have a uniform XML file format prior to being fed to the report tool engine 104. One having ordinary skill in the art must appreciate that in a different embodiment, for instance, a test execution output having an excel test execution output format can be fed to the report tool engine 104 without being converted to a uniform XML format. In one example, the report tool is designed so as to permit the users define the file transformer of the user. For instance, an excel file is configured to implement an associated excel transformer configured to translate a content of the excel file to the report tool internal file representation.

As shown, the report tool engine 104 includes a reader adapter layer 104a, a core layer 104b, and a query layer 104c. The reader adapter layer 104a contains a plurality of reader adapters 112, which in one example, can be Java objects such as EJBs. In one embodiment, each reader adapter 112 includes a business logic to read and understand the test execution outputs. For instance, if the test execution outputs have been standardized, the reader adapter 112 reads the standardized test execution outputs having the XML file format, otherwise, the reader adapter 112 reads the test execution outputs. The reader adapters 112 then convert the test execution outputs having similar or dissimilar formats into XML text execution data. Thus, in accordance with one embodiment, a first transformation of the test execution output files occur using the reader adapters 112 of the reader adapter layer 104*a*. In one example, each XML test execution data is stored to a respective XML data storage component 114, which in one embodiment is a Java object such as an EJB.

As can be seen, in addition to the XML data storage EJBs 114, the core layer 104*b* includes a plurality of user profile component 116, which in one embodiment, are Java objects, such as EJBs. In one example, each user profile component 116 stores data as to a type and output medium selected to report the XML test execution data for a particular user. The user profile components 116 that are in contact with the respective XML data storage EJB 114 are fed to a writer adapter 122, which in one example, is a Java object such as an EJB. The writer adapter 122 uses the XML test execution data and the user profile components 116 to write a profiled test execution data stored to a result data storage 106. In one example, the result data storage 106 is also a Java object. At this point, a second transformation of data has occurred. That is, XML test execution data stored to the XML data storage 114 having the XML file format is transformed into a profiled test execution data having different formats. Additional information about second transformation of data is provided below with respect to FIG. 3.

By way of example, the user 110 accesses the reading and verification engine 108 using a password and a user name. At this point, the user may implement XSLT to view the user data stored to the result data storage 106 in an HTML format. Of course, using the profiled result data enables the user 110 to view the user data in the type and medium selected by the user 110 as set forth in the profile of the user. Upon viewing the profiled test execution data of the user 110, user 110 may select to press a verify button 108'*a* so as to verify the profiled test execution data for a specific test case or a particular test suite. Once the profiled test execution data has been verified, the user 110 may select to update the XML test execution data stored to the XML data storage component revealing the verified status of the verified test cases or test suites. In such scenario, upon pressing the update button, the profiled test execution data stored to the result data storage 106 is updated and communicated to an updates component 120 defined in the query layer 104*c*. In one example, the updates component 120 is a Java object, which in one instance, is an EJB. Upon receiving the updates, the XML test execution data is updated so as to reflect the modifications, changes, and validation of data by the user 110. At this point, verified test execution data can be provided to the user or any other subscriber having been granted access. Additional information with respect to interactions between users and the report tool is provided below.

Figure 2A:
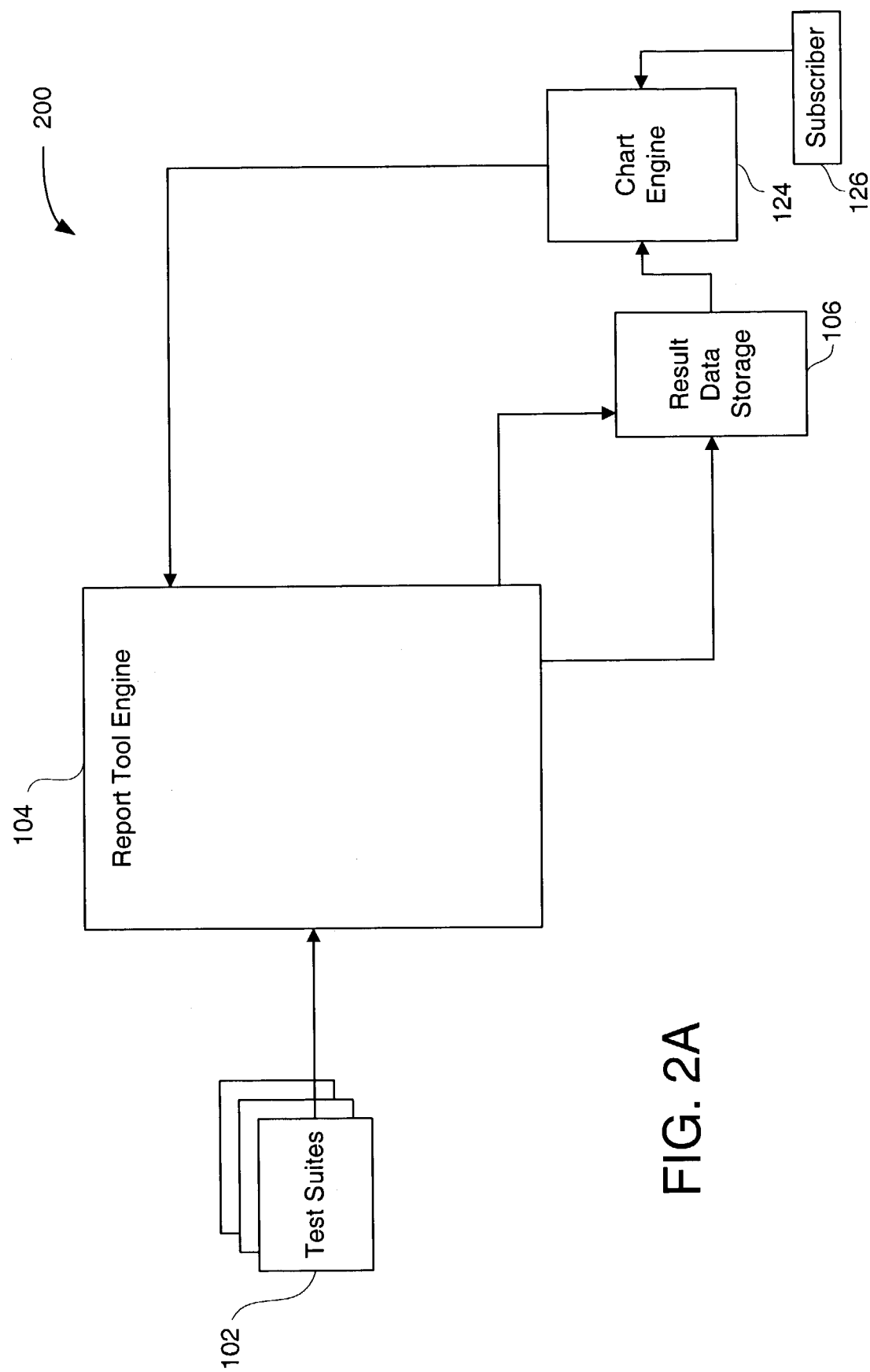
FIG. 2A is a simplified block diagram depicting a subscriber accessing a verified test execution data of the user utilizing an exemplary report tool, in accordance with another embodiment of the present invention.

FIG. 2A is a simplified block diagram illustrating a subscriber 126 accessing of verified test execution data using a report tool 200 of the present invention, in accordance with one embodiment of the present invention. As shown, test execution outputs of the plurality of test suites 102 are fed to the report tool engine 104. In turn, profiled test execution data produced by the report tool engine 104 is stored to the result data storage 106, which in turn, is in communication with a chart engine 124.

A subscriber 126 requesting a certain report having a specific format uses the chart engine 124 to communicate with the report tool engine 104. Then, a requested test execution data produced by the report tool engine 104 is communicated to the result data storage 106, which in turn generates the requested report using the XML profiled test execution data in the result data storage 106. Additional information regarding the interaction between the subscribers and the report tool engine 104 is provided below with respect to FIG. 2B.

Figure 2B:
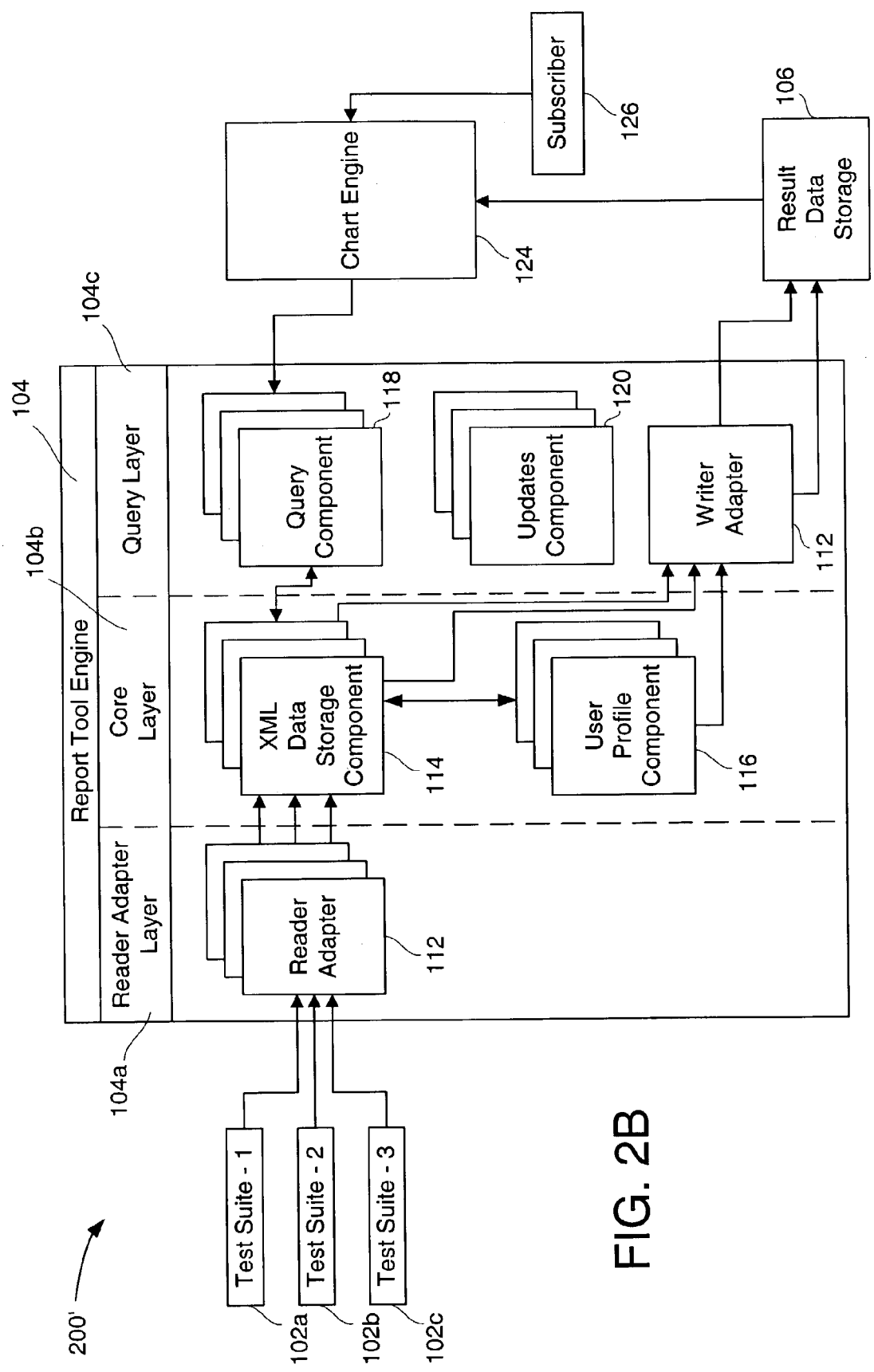
FIG. 2B is a simplified block diagram depicting internal communications between the components of an exemplary report tool engine, in accordance with another embodiment of the present invention.

Reference is made to FIG. 2B depicting further internal communications between the components of the report tool engine 104, in accordance with one embodiment of the present invention. As can be seen, the subscriber 126 queries the XML data storage component 114 for a specific data using a plurality of query components 118. As shown, in one example, the query components 118 are Java objects, which in one example, are EJBs. The requested XML test execution data is then communicated to the writer adapter 122. The report type format and the medium type selected by the subscriber 126, as stored in the user profile components 116, are then used by the writer adapter 122 to create a required result data to be stored to the result data storage 106. In one example, the requested result data is then communicated to the chart engine 124, which uses XSLT to display the requested result data in HTML.

Figure 3:
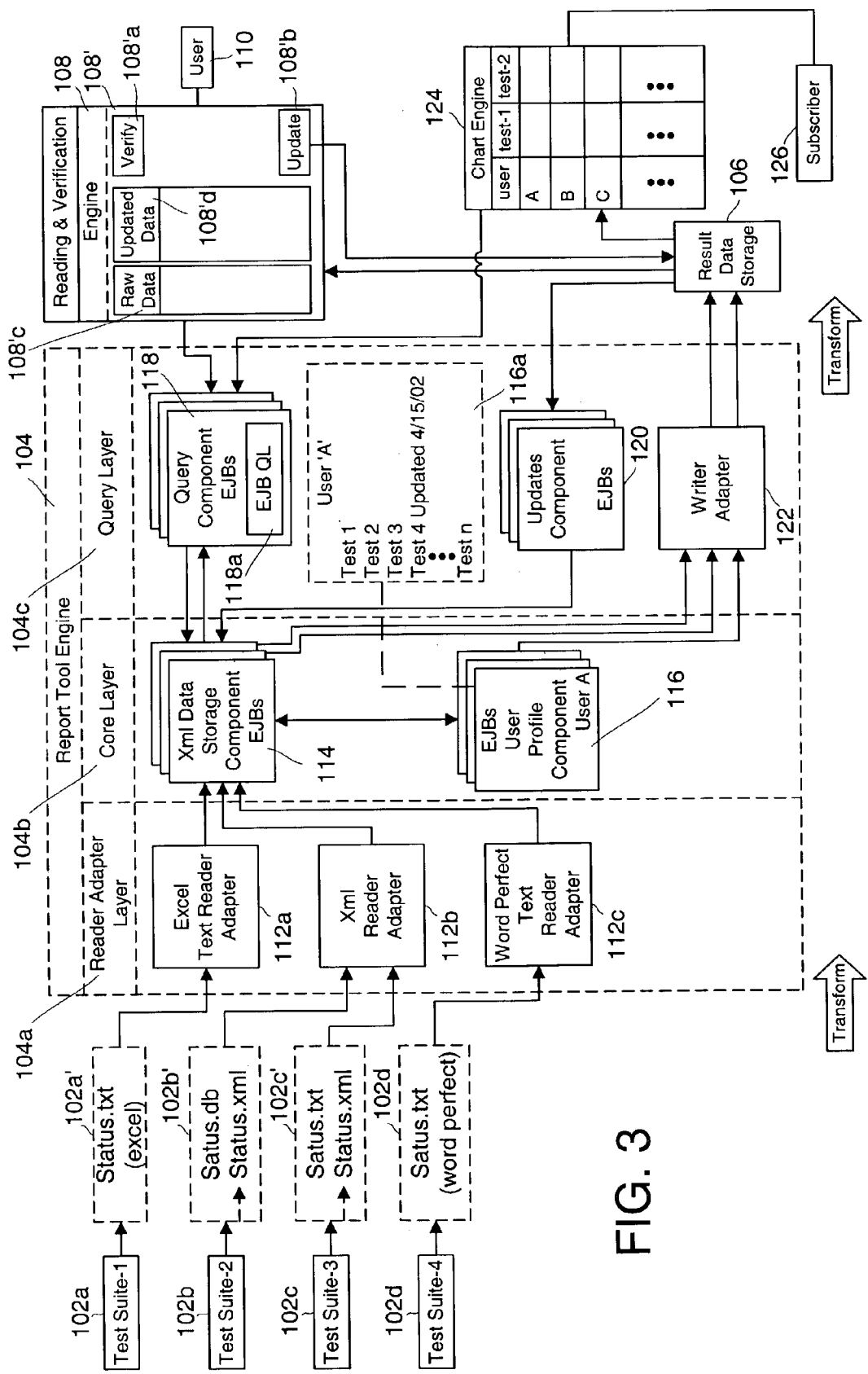
FIG. 3 is a simplified schematic diagram depicting automatic storing of the profiled test execution results, in accordance with another embodiment of the present invention.

Automatically storing the profiled test execution results of the present invention can be understood with respect to the simplified block diagram of FIG. 3, in accordance with one embodiment of the present invention. In one implementation, a plurality of test suites 102*a*–102*d* are designed to test the functionality of an application. In one embodiment, the test suites 102*a*–102*d* may be designed to ensure the proper functionality of a Java™ 2 Platform, Enterprise Edition (J2EE). J2EE for instance, defines the standard for developing multitier enterprise applications. J2EE further simplifies enterprise applications by establishing the J2EE applications on standardized, modular components, by providing complete set of services to those components, and by handling details of J2EE applications automatically, without complex programming.

As can be seen, each of the test suites 102*a*–102*d* has a different format. For instance, the test suite 102*a* having a text format is shown to have created a status.text 102*a'* report format, which in one example, can be Excel. As further shown, the test suite 102*b* has a format of status.db 102*b'* and the test suite 102*c* has a report format of status.txt 102*c'*. Nevertheless, each of the status.db 102*b'* and status.txt 102*c'* has been transformed so as to have the standardized format of status.xml. The test suite 102*d* is shown to have a status.txt 102*d'* report format, which in one instance is WordPerfect.

As illustrated, while the report formats status.txt 102*a'* and status.txt 102*d'* are shown to have been used without further transformation, the report formats status.db 102*b'* and status.txt 103*c'* are shown to have been transformed to an standardized status.XML format. In one example, where executable files for each of the test suites 102*b*–102*c* exist, the report formats status.db and status.txt 102*b'*–102*c'* are standardized by transforming the report formats status.db and status.txt 102*b'*–102*c'* to the standardized .XML format. In a different embodiment, however, where a software code for the test suite exists and the size of the software code is very small (e.g., maximum approximately 5 Megabytes), the software code is converted generating a report having the .XML format. Thus, the embodiments of the present invention have the capability to use standardized report formats wherein depending on the scenario, the report formats can either be transformed or converted to the required format. Additionally, the embodiments of the present invention so as to be backward compatible.

With continued reference to FIG. 3, test execution outputs, having similar or dissimilar report formats, are then fed to a respective reader adapter defined in the reader adapter layer 104a of the report tool engineer 104. That is, the test execution report of status.txt 102a' having Excel format is fed to a corresponding excel test adapter 112a, the test execution reports of status.XML of the status.db 102b' and status.txt 102c' are fed to the XML adapter 112b, and the test execution report of status.txt 102d' is fed into the word perfect test adapter 112c. At this point, the first transformation of the test execution reports from the test execution reports respective initial test execution formats to the XML test execution format is completed.

The respective XML test execution data from each of the reader adapters 112a–122c is then stored to the XML data storage component 114. As shown, the XML data storage component 114 includes a plurality of EJBs, allowing the XML test execution data for each test suite to be stored in a separate EJB. Simply stated, in one example, each test execution format and test execution configuration is designed to have a corresponding EJB. Thus, each test execution data is stored in the J2EE application using a corresponding EJB. In implementation, for instance, the XML test execution data is stored in the EJB using a database.

One of ordinary skill in the art must appreciate that the test execution data may be stored in any appropriate data storage component (e.g., file systems, a database, CD ROM, tapes, etc.) Additionally, one of ordinary skill in the art must appreciate that in a different implementation, the AL data execution data may be stored to the data storage component using any appropriate data storage structure (e.g., databases, tables, etc.).

With continued reference to FIG. 3, the user profile component 116 is shown to be in communication with the XML data storage component 114. In the illustrated embodiment, the user profile component 116 is in the form of a plurality of EJBs, wherein each user profile 116 is associated with a separate EJB 114. In one example, the user profile component 116 stores data associated with the type and output medium selected by a particular user to report the XML test execution data for the user.

Once storing the XML test execution data to the XML data storage component 114 has concluded, the XML test execution data in conjunction with user profile component 116 are fed to the writer adapter 122. In this manner, the XML test execution data 114 for each user, in accordance with the type and output medium selected to report the XML test execution data for the user. In one example, the writer adapter 122 may transform the XML execution for a given user to a profiled test execution data having an XML format. In another embodiment, the writer adapter 122 may transform the XML test execution data for a different user to a different format selected by the user (e.g., text (.txt), database (.db), mail (.mail), etc.). In one exemplary embodiment, a separate writer adapter 122 is used for each file format. At this point, a second transformation of the test execution data has concluded.

In this manner, a user having a user name and password can access the test execution data of the user, using the reading and verification engine 108. In one implementation, the reading and verification engine 108 is a web application implementing a web browser. In one embodiment, a screen 108' of the reading and verification engine 108 is shown to have a plurality of buttons such are verify 108'a and update 108'b and fields marked as raw data 108'c and updated field 108'd. By way of example, the user A accesses the reading and verification engine 108 using the user name and password of the user 110. Then, the user 110 queries the XML data storage component 114 using the EJB-QL 118a defined in the query component 118. In one example, the user 110 queries the XML data storage 114 for user 110 text execution results for specific test cases or test suites created by the user 110. In one instance, a list of the tests created by the user 110 (e.g., user A) is defined in the user profile component 116 for the user 110. By way of example, the user profile component for the user A includes the tests shown in 116a (e.g., test 1 through test$_n$).

Subsequent to receiving the query from the user 110, using the user profile component 116 for the user 110 (or user A), the XML test execution data for the user 110 is fed to the writer adapter 122. Thereafter, the transformed requested result data generated by the writer adapter 122 is stored to a result data storage 106. In one example, the user 110 may select that the requested result data for the user 110 be transformed into an XML file. The user 110 can further choose to view the requested result data of the user by utilizing reading and verification engine 108 using XSLT. As a result, in one implementation, the raw data field 108c contains the user 110 requested result data.

As will be discussed in more detail below with respect to FIGS. 5A–5E, the user 110 can either accept or reject the requested result data prior to verifying the requested result data by pressing the validate button 108a. Once verified, the requested result data stored to the result data storage 106 is updated by pressing the update button 108'b. As a result, in one example, the screen 108' is shown to include the updated data field 108'd designed to include the updated result data.

At this point, the updated result data is used to update the XML test execution data stored to the XML data storage component 114 using the updates component 120. As shown in the illustrated embodiment of FIG. 3, the updates component 120 can be a plurality of EJBs. In this manner, the XML test execution data stored into the XML data storage component 114 is updated by the user 110, which in one example, can release the XML test execution results to other authorized subscribers (e.g., the subscriber 126).

With continued reference to FIG. 3, after the user 110 has released the test results of the user, the subscriber 126 is shown to have accessed the XML test execution data for the user 110, as well as users B and C (not shown in this Figure). In one embodiment, the subscriber 126 may receive reports having a specific type and viewing medium, as selected by the subscriber 126 and as stored to the user profile component 116. This is beneficial as in one example, the subscriber 126 may also be the user 110 attempting to obtain the released test results of the user (e.g., the subscriber).

In one example, the subscriber 126 may use the chart engine 124 to request that a report covering certain XML test execution data be generated in a format selected by the subscriber 126. In one such scenario, the subscriber 126 makes a query for the selected XML test execution data using the EJB-QL 118a of the query component 118. Thereafter, using the type and medium selected by the subscriber 126, the selected XML test execution data is fed to the writer adapter 122. The selected result data having the format selected by the subscriber 126 is then provided to the chart engine 126, which in turn, displays the report in the medium requested by the subscriber 126. In one example, the subscriber 126 may select to view the generated report in HTML using the XSLT transforming capabilities.

Figure 4:
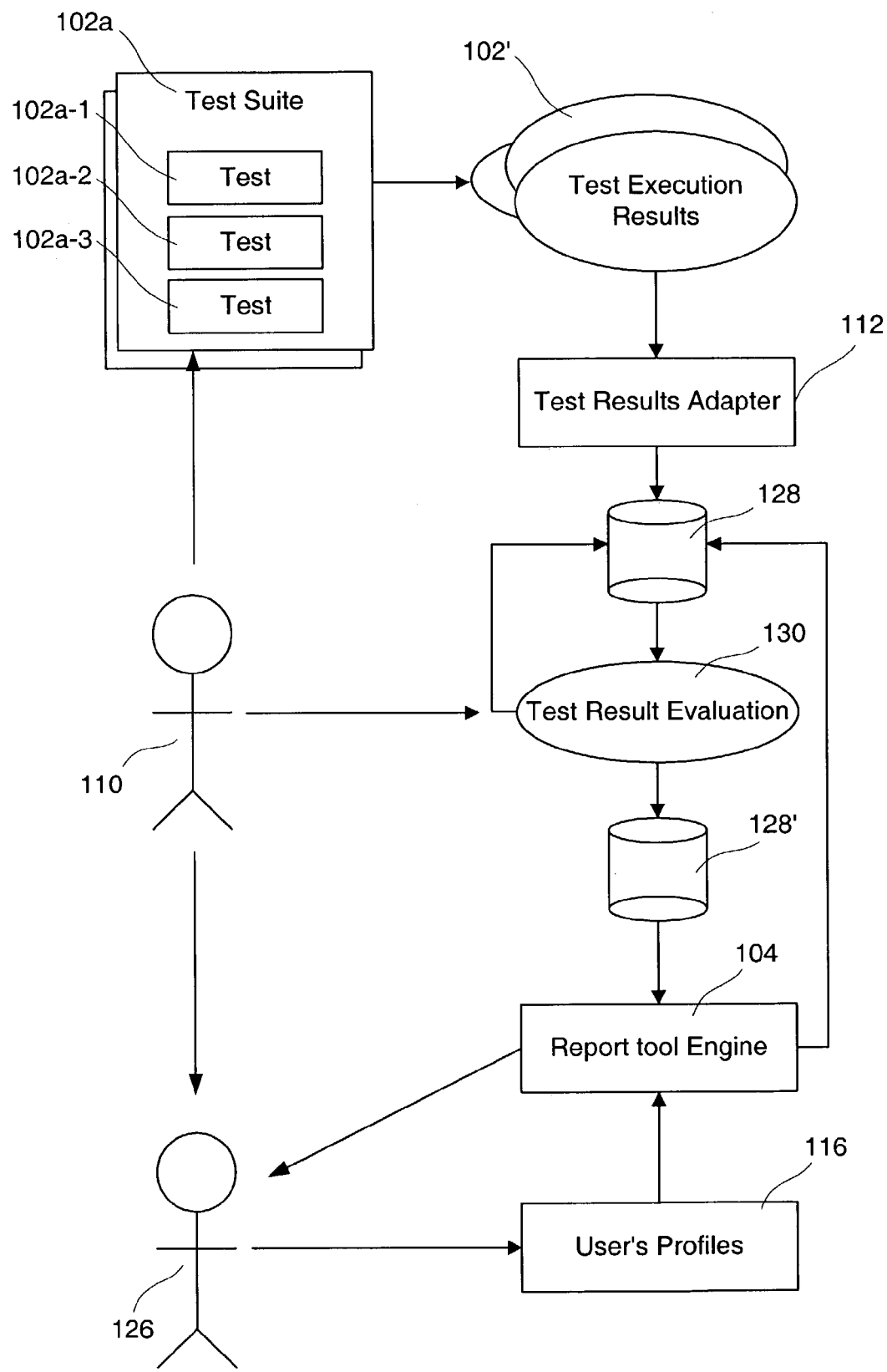
FIG. 4 is a block diagram illustrating the use of an exemplary report tool engine to generate customized profiled reports from accepted test results of the user, in accordance to yet another embodiment of the present invention.

Reference is made to a simplified block diagram of FIG. 4 depicting the use of a report tool engine 104 to generate customized profiled reports from the user 110 accepted test results, in accordance with one embodiment of the present invention. The user 110 is shown to have created and registered a plurality of tests 102a-1 through 102a-3 of the test suite 102a to test the functionality of the J2EE. The test execution results 102' resulting from the execution of the tests 102a-1 through 102a-3, are fed to the test results adapter 112, which in one embodiment, is configured to transform the test execution results 102' from its original format to the XML format. The XML test execution results are then stored to a persistent storage component 128, which in one embodiment is a database structure in an EJB. At this point, the user 110 can evaluate the XML test execution results using a test result evaluation 130. XML test execution results accepted by the user 110 in test result evaluation 130 are then stored to a persistent storage 128' while the rejected XML test execution results remains stored in the persistent storage 128.

The accepted XML test execution results stored to the persistent storage 128' is next fed to the report tool engine 104, which in one example, notifies the subscriber 126 of the releasing of additional accepted XML test execution results. In one embodiment, the report tool engine 104 is capable of generating a report of XML test execution results of the failed tests, if any, for the user 110. It must be mentioned however, that in one embodiment, only the user 110 creating the rejected test results can receive a report of the failed tests of the user. In one example, the subscriber 126 receives customized report of the XML test execution results using the profile components 116 of the user.

In one exemplary embodiment, the report tool of the present invention can be implemented to provide test execution results to a wide range of audiences requiring different data. For instance, quality engineers need test execution results to evaluate the quality of the product so as to test the workspace of the quality engineer. Development engineers need to determine whether any bugs exist in the source code so that the development engineer can rely on the test execution results. Development engineers also need to create a test case to specifically find and fix the existing located bug.

The quality engineer leads and line managers need to have a broader access to the test execution results. For instance, the quality engineer leads and line managers would like to determine where to focus the testing resources and not so much on detail about the actual bug. The program managers and release teams would like to know the product stability so as to decide the specific time the product can be shipped.

Thus, the embodiments of the present invention enable automatic storing of standardized test execution results in a database and reporting of test execution results tailored to the requirements of a role or a specific user. In one example, each test execution result has an associated state of "raw" or "verified." The test execution results are released, meaning moving a test results state from one state to another. By way of example, substantially all of the failed test execution results are initially set to have a raw state, as the quality engineers do not know whether the failures are product of failures or non-product failures. Thus, as can be appreciated, raw test execution results do not reflect the quality of the product or any of the test execution reports generated from raw test results. Once quality engineers verify the test execution results, the test execution results reflect the quality of the product more accurately. Once the quality engineers have confirmed that the test execution failure is due to a product failure, the state of the test execution results is set to verified. It must be noted that test execution result reports generated based on verified test execution results reflect the quality of the product more accurately and are more useful for development and program managers.

In one exemplary embodiment, data provided in Table 1 below are the types of test execution result data users utilize.

TABLE 1

Task Development Priority

| TASK | PRIORITY |
|---|---|
| Ability to implement a single format for substantially all test execution result reports. | P3 |
| Ability to view current test execution results over time. | P2 |
| Ability to customize the type of test execution result reported. | P2 |
| Ability to specify the medium used for displaying the test execution data. | P1 |
| Ability to read test execution result into standard report tools (e.g., Crystal Report, Formula One, etc.). | P3 |
| Ability to automatically email requested test execution to user. | P1 |
| Ability to modify/add/delete test execution results (e.g., data used to filter non-product bugs) and add comments prior to generating test execution result reports. | P1 |
| Ability to redirect test execution results to another team member. This is beneficial as if the team member would who is the owner of the test execution results is out of the office, another member of the team can be allowed to evaluate the bugs. | P1 |
| Ability to query test/test suite archive. | P3 |
| Ability to generate test execution reports linked to BugTraq. | P1 |
| Ability to run new tests prior to incorporating the test execution results in the reporting process. In this manner, the engineer is allowed to fix the test bugs before reporting product bugs, if any. | P3 |
| Ability to base the report tool on the J2EE Application Model defined in J2EE 1.3 specifications as well as the actual J2EE Blueprints documentation. | P1 |
| Ability to generate a report prior to detecting the existence of a bug, if any. | P1 |
| Ability to generate report using a platform implemented to execute the tests. | P1 |
| Ability to select the detail level of failure and generate a wide spectrum of reports ranging from summary reports to very detailed reports. | P1 |
| Ability to generate a report based on a specific time frame. In one example, one axis can be failure and the other time. The report can be generated as a bar chart, a strip chart, a table, etc. | P1 |
| The ability to include a table where the rows represent test suites and the columns represent the different test configurations. In one example, a table having such characteristics can be primarily implemented by the quality engineers. | P1 |
| The Ability to create information (e.g., critical information). In one example critical information can be created by:<br>•Using the actual statusU tool;<br>•Using the Test Description JSP.<br>QE requirements: Persistent Storage. | P3 |
| The ability to implement a simple database table structure. In one example, complex join may be avoided so as to speed the report generation. | P3 |
| The ability to hide certain information from third party vendors, such as user password, user profile, etc. | P1 |
| The ability to implement interface. For instance, the first version of the report tool can use JSP to generate GUIs. In one instance, applet and application can be added if required. For example, BugTraq has an HTML interface as well as a GUI (application) interface. | P1 |
| The ability to store user profile using XML. In this manner, the user can be allowed to change the user profile by editing the XML file of the user. | P1 |

Table 2 below provides the requirements needed by different types of users.

TABLE 2

User-based Report Content Requirement

|  | QE | QEL | DE | MQE | MD | QEM | PMD |
|---|---|---|---|---|---|---|---|
| For Total Run: | | | | | | | |
| #Tests Run | X | X | | | | | |
| # New Tests | | | | | | X | |
| # Tests Passed | | | | | | | |
| New Tests | X | X | | | RI | | |
| Old Tests | X | X | | | RI | | |
| # Bugs fixed | | X | | | RI | X | |
| # Tests Failed | | | | | | | |
| New Tests | X | | | | RI | X | |
| Old Tests | X | | | | RI | X | |
| BugID | | | | | RI | | |
| Description | X | | | | RI | | |
| #Wks. Open | | | | | RI | X | |
| For Each Technical Area: | | | | | | | |
| Test Suite | X | X | | | | | |
| Test Case | X | X | | | | | |
| Test Owner | X | X | | | | | |
| # Existing Tests | | | | | | | |
| # Tests Run | X | X | | | | | |
| # New Tests | | | | | | X | |
| # Tests Passed | | | | | | | |
| New Tests | X | X | | | RI/TC | | |
| Old Tests | X | X | | | RI/TC | | |
| Fixed since last build | | X | | | RI/TC | X | |
| # Test Failed | | | | | | | |
| New Tests | X | | | | RI/TC | X | |
| Old Tests | X | | | | RI/TC | X | |
| BugID | | | | | RI/TC | | |
| Description | x | | | | RI/TC | | |
| #Wks. Open | | | | | RI/TC | X | |
| # of test failures for BugID | | | | | RI/TC | | |
| CONFIGURATION | X | | | | RI/TC | | |
| Unassigned Test Failures | X | | | | RI/TC | | |

QE = QE Engineer
QEL = QE Lead
DE = Dev. Eng
MQE = 1st Line Mgr.: QE
MD = 1st Line Mgr.: Dev.
QEM = QE Mgr.
PMD = Prog. Mgmt./Directors Required test information by the quality engineer managers, quality engineers, and quality engineer leads are shown below in Tables 3.

TABLE 3

User-based Test Requirements

| User | Required Test Information |
|---|---|
| Development Eng. 1st Line Mgr.: QE 1st Line Mgr.: Dev. QE Mgr. | For each technical area and in Total: # Existing Tests # New Tests # Tests Run # Tests Passed -> # Fixed Bugs (verified by this run) |

TABLE 3-continued

User-based Test Requirements

| User | Required Test Information |
|---|---|
| Prog. Mgmt./Directors | # Tests Failed -> # Old Failures -> For each failure-How long OPEN View these results over time |
| QE Eng. | # Tests Run (Predicted) # Tests Passed # Tests Failed and why -> For each failure-Bug ID Test Category: Standard, Integration, API, GUI, Manual Test Owner Technical Area: COBRA, EJB, etc. Test Suite Name Test Case Name Test Configuration |
| QE Lead | # Tests Run (Predicted) # Tests Passed # Tests Failed and why -> For each failure-Bug ID Test Category: Standard, Integration, API, GUI, Manual Test Owner Technical Area: COBRA, EJB, etc. Test Suite Name Test Case Name Test Configuration |
| Engineers | Failure localization Personal profile Failure comparison against configuration (JDK version, connector, database, nightly or promoted, etc.) Bugtraq link Audit trail (release or reject) |

Figure 5A:
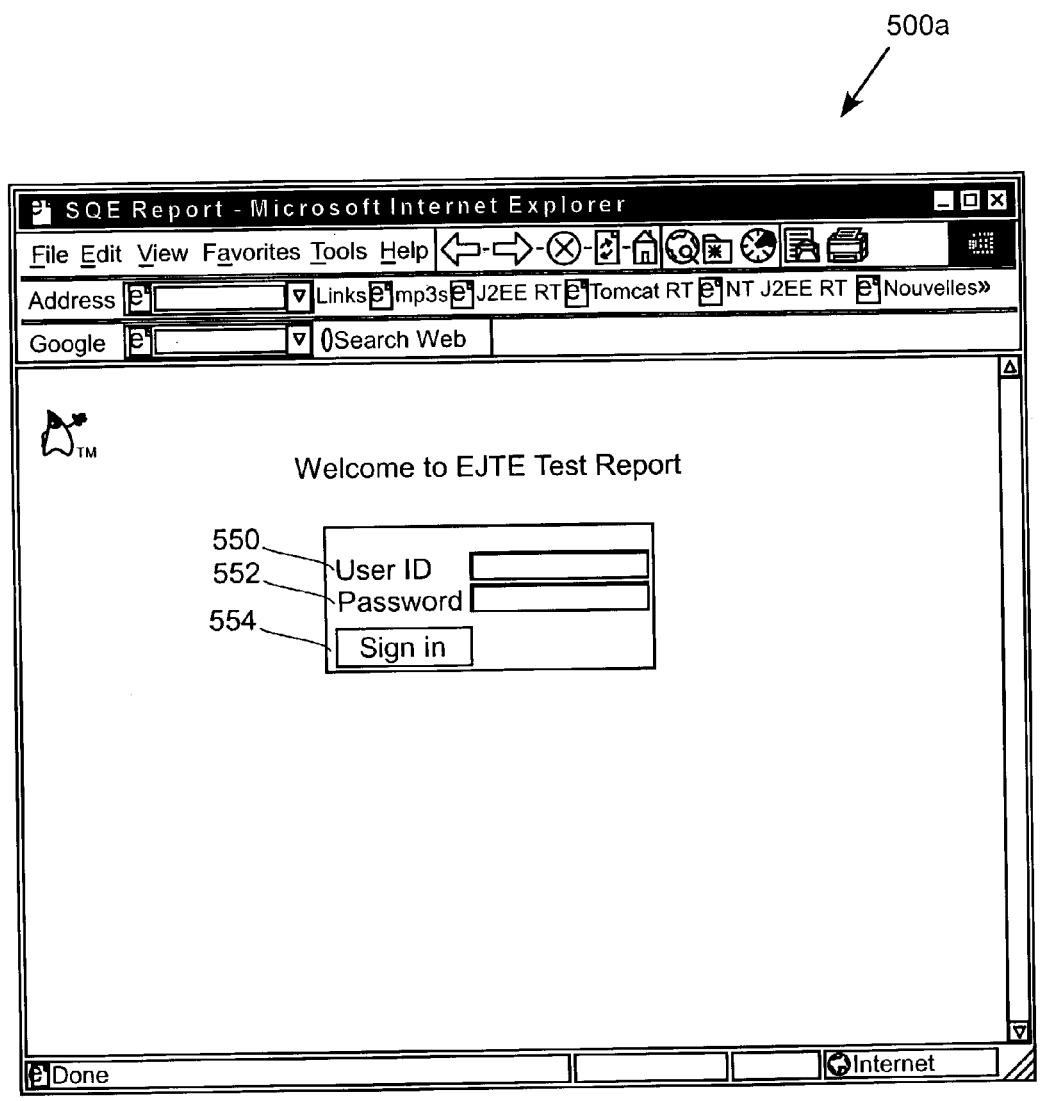

FIGS. 5A–5F are exemplary graphic user interfaces (GUI) implemented by the users and subscribers to interface with the report tool so as to view reports generated using the test execution results, in accordance with one embodiment of the present invention. FIG. 5A depicts the log in GUI 500*a*. As shown, the user is asked to input the user identification and password of the user in the respective fields 550 and 552. Thereafter, signing in concludes by the user pressing a sign in button 554.

Figure 5B:
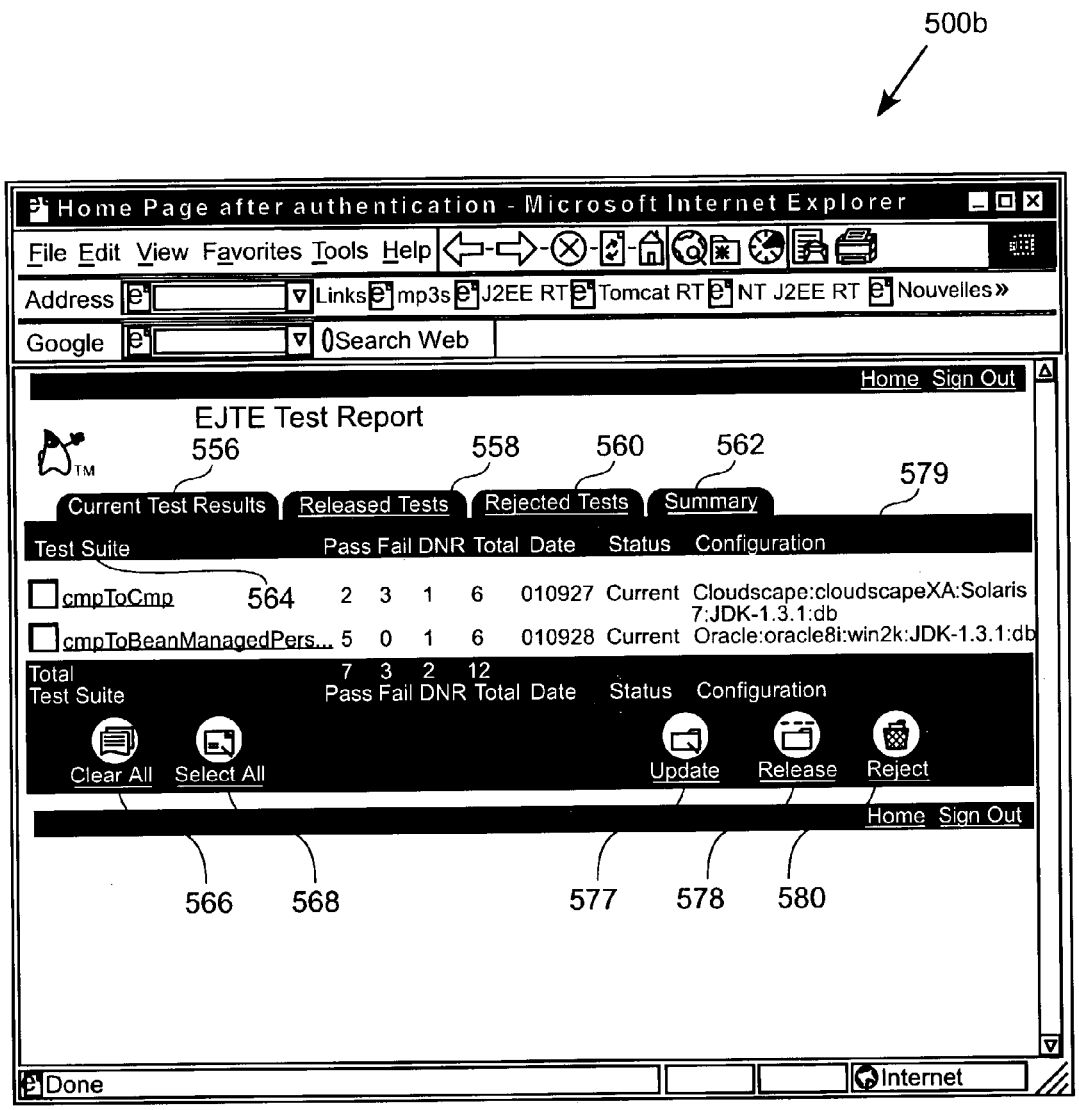

Upon logging in, the exemplary results GUI 500*b* depicted in FIG. 5B appears. As can be seen, the results GUI 500*b* provides the user with a plurality of options current test results 556, released tests 558, rejected tests 560, and summary 562. In the embodiment shown in FIG. 5B, the user is provided with the current test results 556 for two test suites 564. As further illustrated, the number of passed, failed, and Do Not Recognized entries are shown for each test suite as well as their respective totals. Additionally, the results GUI 500*b* shows the data and status of each test suite as well as the configuration 579 for each test suite 564.

As also shown, the user is given an option to clear all 566, select all 568, update 577, release 578, and reject 580 the test results for any of the test suites 564.

Figure 5C:
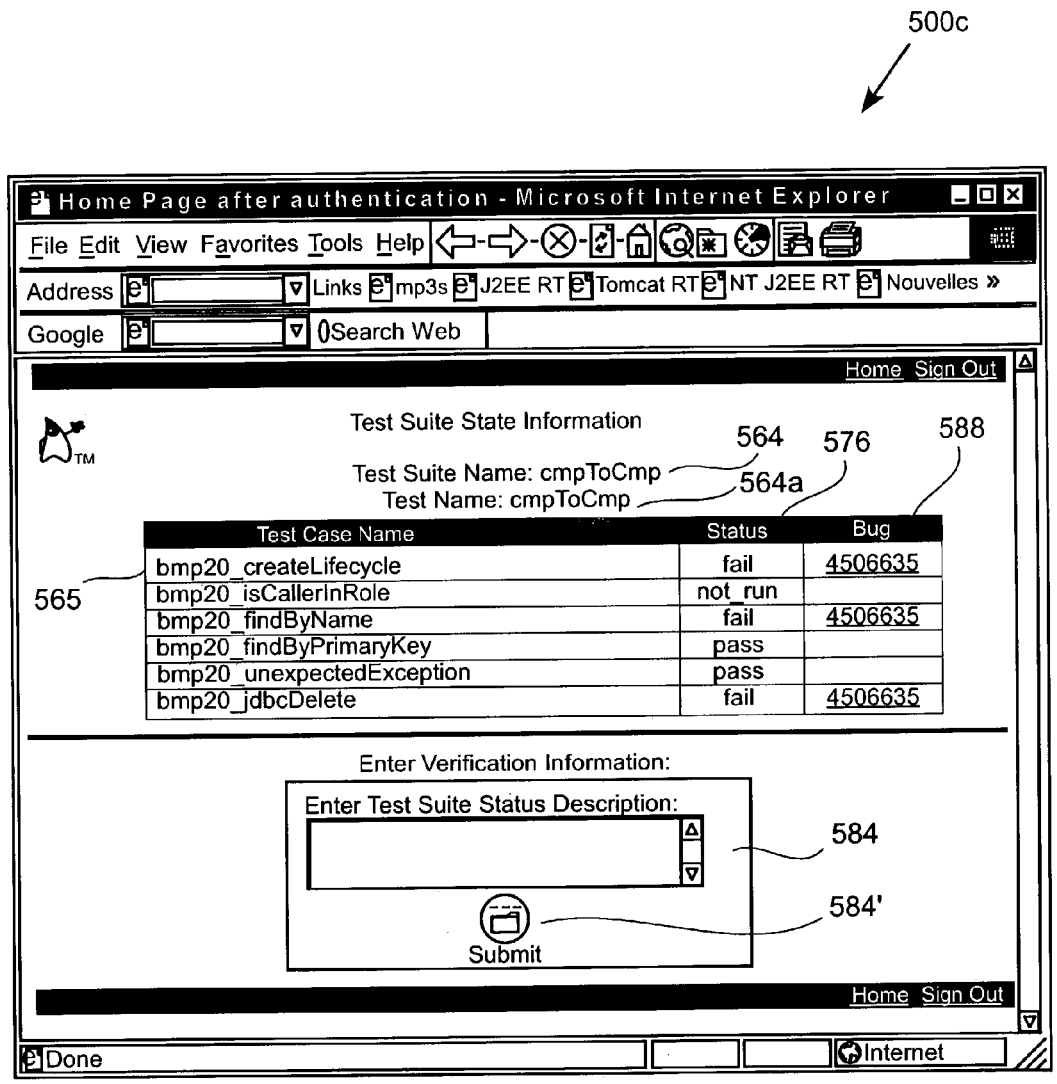
Figure 5D:
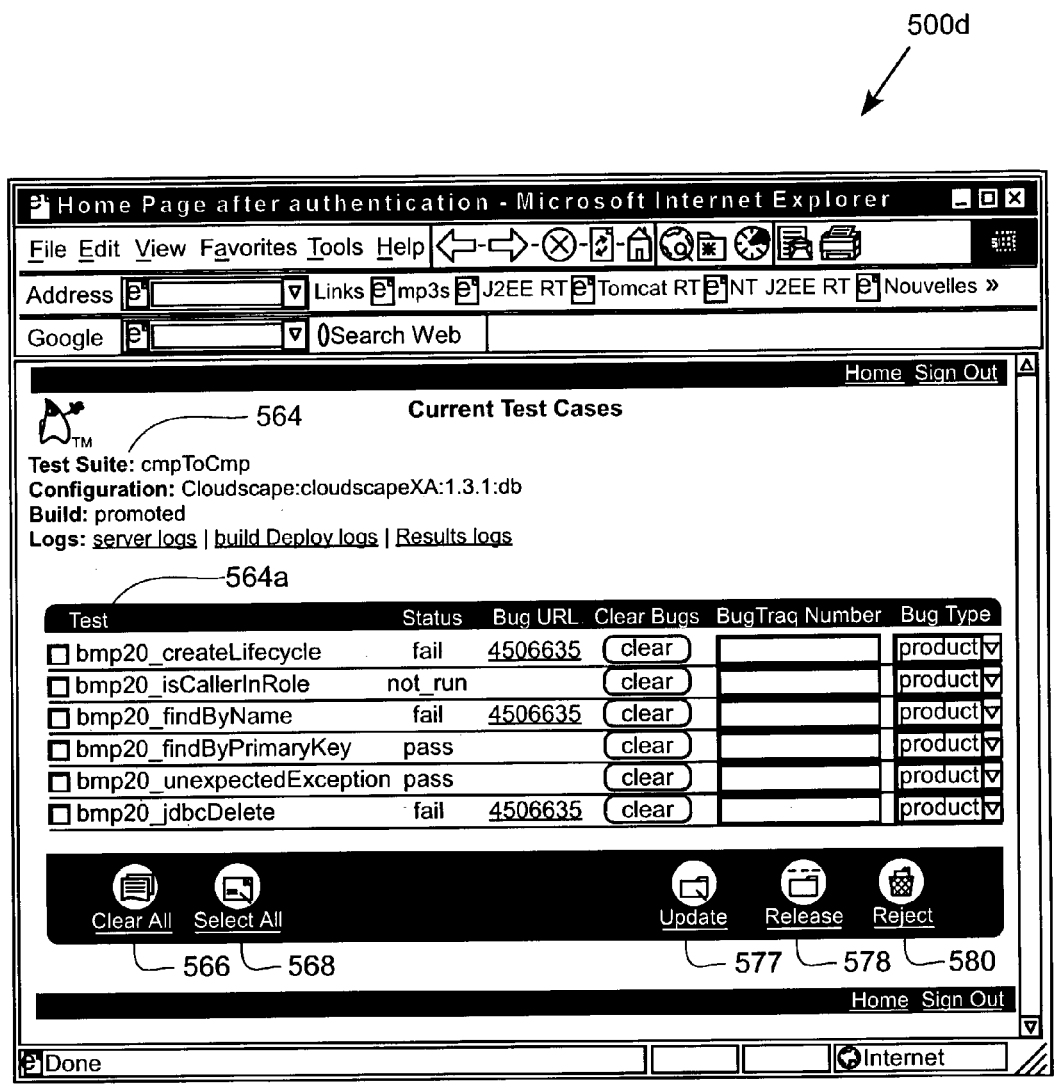
Figure 5E:
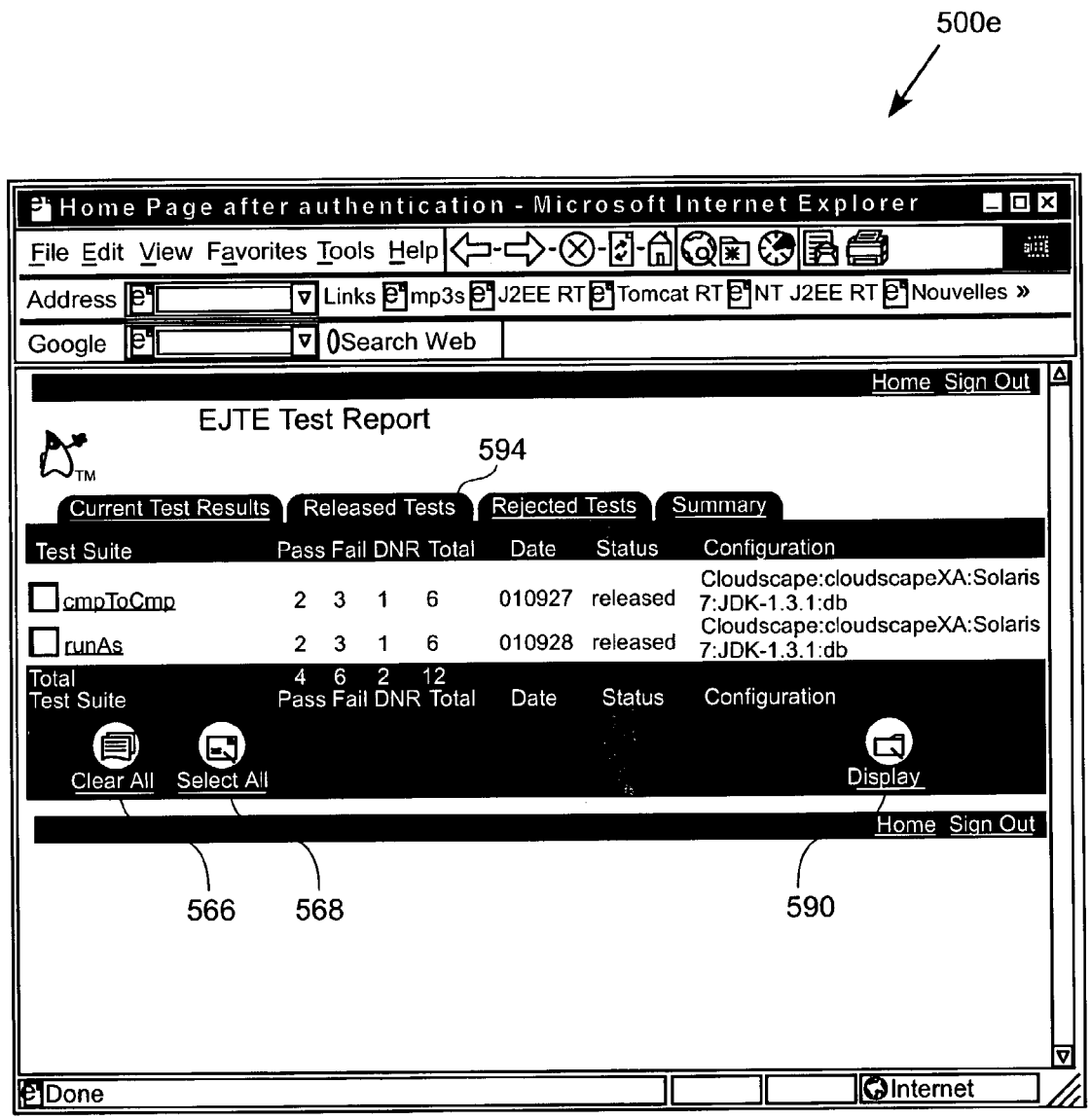

Reference is made to FIG. 5C depicting an exemplary verification GUI 500*c*, in accordance with one embodiment of the present invention. As shown, a test 564*a* of the test suite 564 is shown to have a plurality of test cases 565, each having a status field 576 and a bug field 588. The verification GUI 500*c* is configured to display whether a test case has pass, fail, or not run status. Furthermore, the GUI 500*c* is configured to display a bug number 588 for the bug causing a failed test case to fail. In this manner, while reviewing the test execution result displayed by the GUI 500c, the user can determine whether failing of a test case is due to a detection of bug in the application being tested or certain problems that may be encountered during running of each test case (e.g., having network problems, etc.). As can be seen, the user enters the verification information by filling in a description of the status for each of the test suites 564 into the test suite status description field 584 and pressing a submit button 584'.

Following the verification GUI 500c, the exemplary update GUI 500d is displayed so as to allow the user update the test execution results for the current test cases. In one example, updating the test execution results occurs by the user pressing the update button 577. Thereafter, the test report for the executed test suites are displayed using the exemplary test report GUI 500e. As shown, the released test button 594 has been pressed showing the released status of the test cases in each of the test suites 564.

In accordance with one embodiment, the report tool of the present invention is capable of generating a summary result of execution of all the test suites as well as results associated with specific configuration and test suite. As can be seen, a table 592 includes the daily summary results categorized by the product version, build type, database, driver, JDK version, operating system, the number of passes and fails, expected runs, and the associated uniform resource locater (URL). As further shown, tables 594 and 596 include the number of passes, fails, and expected passes for the corresponding Cloudscape_cloudscapeXA_Solaris and Oracle_oracle8i_win2k configurations.

Figure 6:
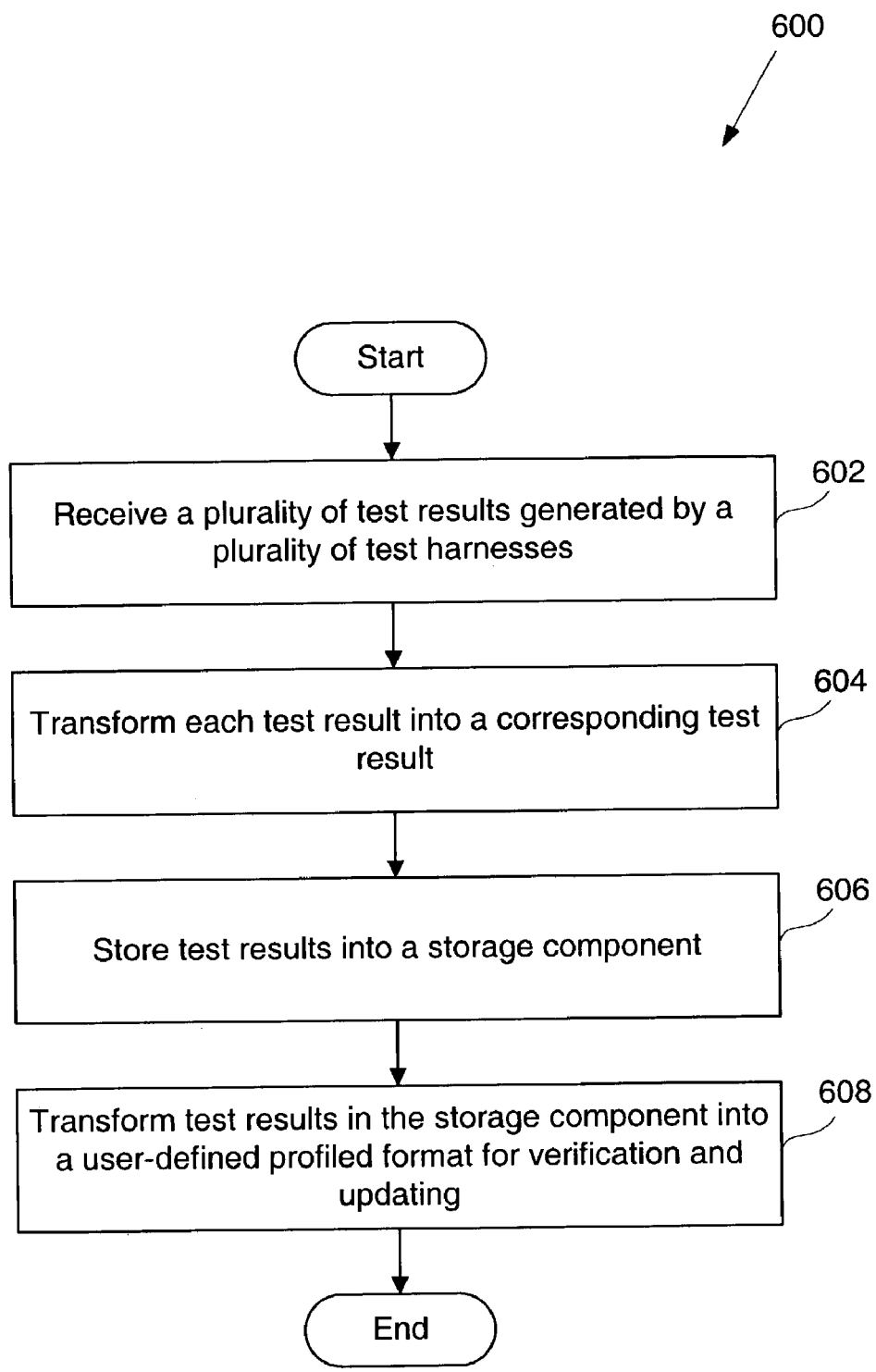
FIG. 6 is a flow chart diagram illustrating a method operations implemented by an exemplary report tool, in accordance with yet another embodiment of the present invention.

FIG. 6 depicts a flowchart 600 illustrating the method operations performed by an exemplary report tool, in accordance with one embodiment of the present invention. The method begins in operation 602 in which a plurality of test results generated by a plurality of test harnesses are received. Next, in operation 604, each test result is transformed to a corresponding XML test result. The XML test results are then stored to a storage component in operation 606 followed by operation 608 in which the XML test results stored to the storage component are transformed into a user-defined profiled format for verification and updating.

In this manner, report tool of the present invention simplifies report generation as well as helping developers maintain high product and test quality. The report tool provides test results subscription, reporting, verification, and persistence over time. The report tool of the present invention can further be implemented to provide test execution results to other report tools (e.g., Statistica, Formula Once, MathML, etc.).

Figure 7:
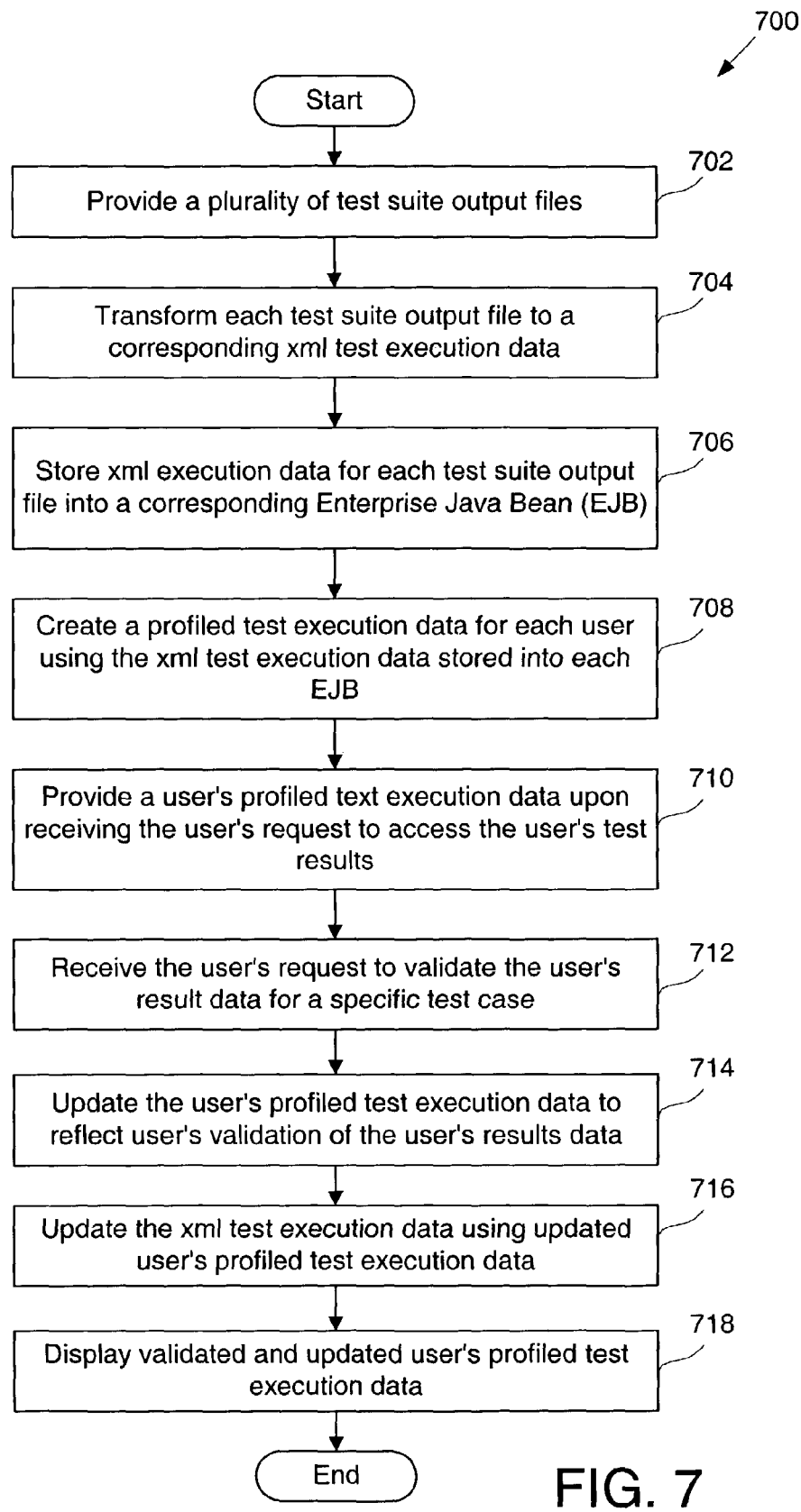
FIG. 7 is a flow chart diagram illustrating a method operations performed by an exemplary report tool interfacing with an exemplary user, in accordance with yet another embodiment of the present invention.

Reference is made to FIG. 7 depicting a flowchart 700 illustrating the method operations performed by an exemplary report tool interfacing with a user, in accordance with one embodiment of the present invention. The method begins in operation 702 in which a plurality of test suite output files are provided. Next, in operation 704 each test suite output file is transformed into a corresponding XML test execution data. In the following operation 706, the XML test execution data for each test suite is stored to a corresponding Enterprise Java Bean (EJB). Moving to operation 708, a profiled test execution data is created for each user utilizing the XML test execution data stored to each EJB.

Continuing to operation 710, a user is provided the profiled test execution data of the user upon receiving the request of the user to access the user's test results. Thereafter, in operation 712 the request of the user to verify the test results of the user for a specific test case in a test suite is received. Next, in operation 714, the profiled test execution data of the user is updated so as to reflect the verification of the result data of the user. In operation 716, the XML test execution data is updated using the updated profiled test execution data followed by operation 718 in which the verified and updated profiled test execution data of the user is displayed.

Figure 8:
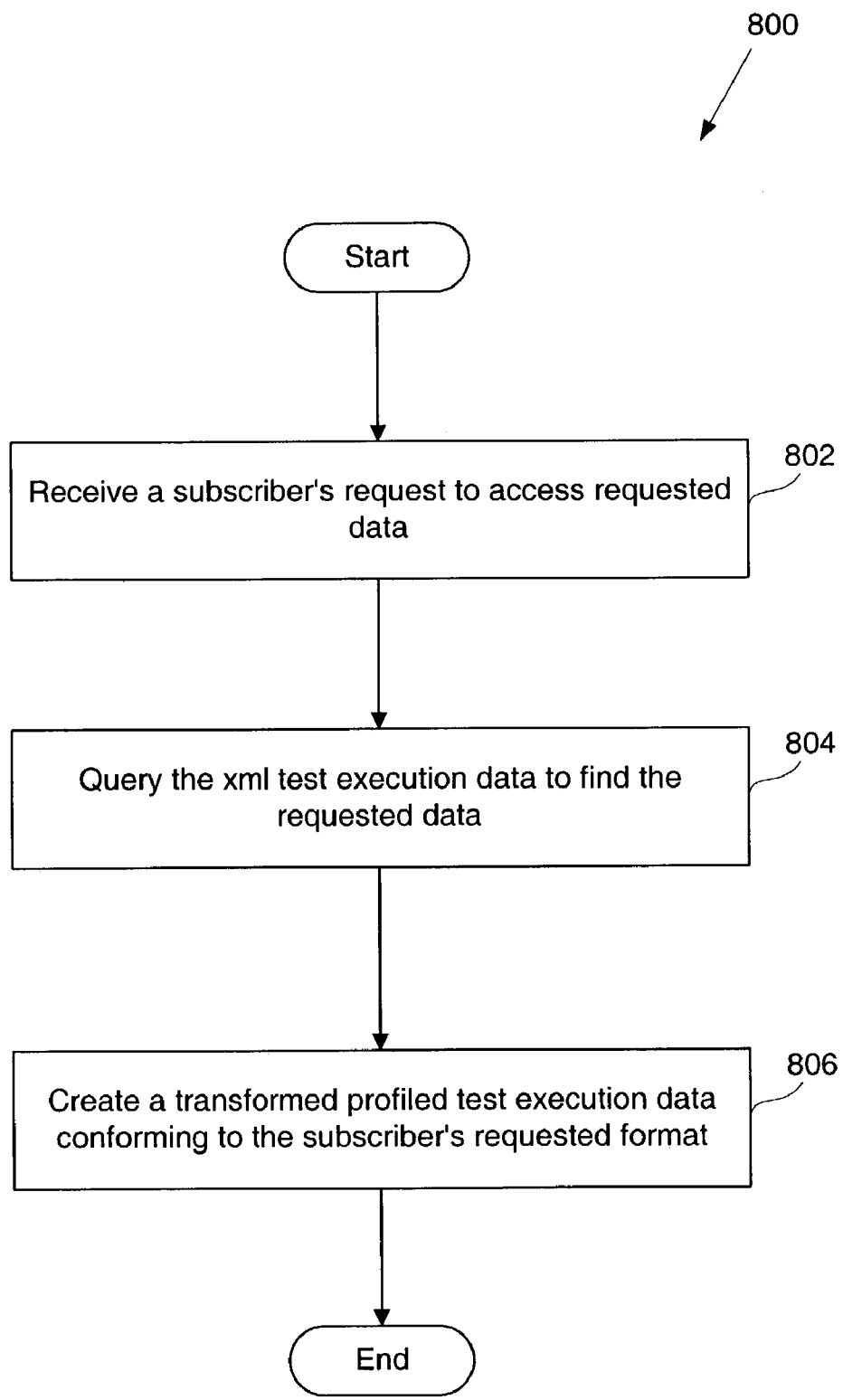
FIG. 8 is a flow chart diagram illustrating a method operations performed during an interaction of an exemplary subscriber with an exemplary report tool, in accordance with yet another embodiment of the present invention.

FIG. 8 depicts a flowchart 800 illustrating the method operations performed during an interaction of a subscriber with the report tool, in accordance with one embodiment of the present invention. The method begins in operation 802 in which a request of a subscriber to access a requested data. Next, in operation 804 the XML test execution data is queried so as to locate the requested data. The method then proceeds to operation 806 in which a transformed profiled test execution data conforming to the requested format of the subscriber is created.

The advantages of the present invention are numerous. Most importantly, the embodiments of the present invention automate report generation. Another advantage of the present invention is that the embodiments of the present invention diminish errors in report generation associated with the prior art. In this manner, beneficially, the group members have less opportunity to introduce inaccurate data such as mistyping information or running the wrong test. Thus, the embodiments of the present invention eliminate the frustration associated with locating and correcting of errors.

Still another advantage of the present invention is that embodiments of the present invention are capable of generating reports rather fast. As test execution results are entered directly into an automated system, generating useful reports or transactional files for use within the organization is faster and easier. Yet another advantage of the present invention is that the report tool of the present invention provides faster access to the test execution results. Still another advantage is that the report tool of the present invention eliminates the need to manually calculate or recalculate test failures/successes or the necessity to perform other time consuming tasks such as manually removing test execution result failures.

Yet another advantages is that the report tool of the present invention can be designed so as to control and trap scripting and database setup errors or any other inaccuracies that may occur during report generation. Still another advantage of the present invention is that generation or reports is performed accurately while test execution result loss associate with the prior art is eliminated. Unlike the manual reporting systems in which establishing of checks and balances to ensure generation of complete and accurate test results, the embodiments of the present invention can automatically compare reports of expected test failures (e.g., generated based on a previous report) with the generated test execution results of the report tool of the present invention, actually comparing results and identifying any untested section of the test suite. Yet another advantage of the present invention is that test execution result reports can be generated in real time by selecting required information. Yet another advantage of the present invention is the ability to automatically distribute test execution result reports. Still another advantage of the present invention is the present invention ability to unify comparison activity between different products. That is, the embodiments of the present invention have the capability to compare test execution results generated in different configurations (e.g., JDK version, database, etc.) as the embodiments of the present invention implement a common format to compare test results.

With the above embodiments in mind, it should be understood that, the invention may be practiced with other computer system configurations including hand-held devices, microprocessor systems, microprocessor-based or programmable consumer electronics, minicomputers, mainframe computers and the like. Furthermore, the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. Furthermore, although the present invention implements Java programming language, other programming languages may be used to implement the embodiments of the present invention (e.g., C, $C_{++}$, any object oriented programming language, etc.).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for generating profiled test execution data using a plurality of test suite output files, the system comprising:
    a plurality of test suites configured to be executed so as to create a plurality of respective test suite output files; and
    a report tool engine configured to automatically transform each of the plurality of test suite output files to a standardized test execution results file, each standardized test execution results file being of an identical file format, the report tool engine further configured to profile each of the standardized test execution results file in accordance with a user profile setting, the profiling configured to generate a profiled data file.
2. A system as recited in claim 1, the system further comprising:
    a result data storage configured to store the profiled data file; and
    a reading and verification engine configured to be used by users to perform one of reading, verifying, and updating using particular ones of the standardized test execution results file and the profiled data.
3. A system as recited in claim 2, wherein the user is configured to implement the reading and verification engine to verify the test suite output files of the user stored as standardized test execution results file.
4. A system as recited in claim 1, wherein the report tool engine includes,
    a reader adapter layer configured to include business logic designed to read and understand the test suite output files, the reader adapter further configured to convert the plurality of test suite output files into standardized test execution results file;
    a core layer including,
        an XML data storage component configured to store the standardized test execution results file; and
        a user profile component configured to store data as to a type and output medium selected by the user in the user profile setting to report standardized test execution results file; and
    a query layer including a writer adapter configured to read the standardized test execution results file and the user profile component so as to create a profiled data file.
5. A system as recited in claim 4, wherein the query layer further includes,
    a query component configured to receive a request to view the standardized test execution results file for the user; and
    an updates component configured to update the standardized test execution results file stored to the data storage component upon receiving an update request from the user.
6. A system as recited in claim 5, wherein the reader adapter, data storage component, user profile component, query component, updates component, and writer adapter are Enterprise Java Beans (EJBs).
7. A system as recited in claim 1, wherein the test suites are configured to test a functionality of a Java™ 2 Platform, Enterprise Edition (2EE).
8. A computer program embodied on a computer readable medium for automatically standardizing test suite output files configured to be implemented to generate verified profiled test execution result files, the computer program comprising:
    program instructions for automatically transforming each test suite output file to a single format;
    program instructions for using the test suite output files in the single format to generate profiled test execution result files;
    program instructions for storing the profiled test execution result files; and
    program instructions for enabling users to access the profiled test execution result files, each user receiving the profiled test execution result files in a predefined user specific format.
9. A computer program embodied on a computer readable medium as recited in claim 8, further comprising:
    program instructions for enabling a specific user to view the profiled test execution result files of the specific user;
    program instructions for enabling the specific user to verify the profiled test execution result files of the specific user; and program instruction for enabling the specific user to update the profiled test execution result files of the user so as to create verified profiled test execution result files.

10. A computer program embodied on a computer readable medium as recited in claim 8, wherein the standardized test execution results have an XML format.

11. A computer program embodied on a computer readable medium as recited in claim 8, wherein the profiled test execution result files has an XML format.

12. A computer implemented method for automatically generating standardized test execution results to be used to generate validated profiled test execution results, the method comprising:
  obtaining a plurality of test suite output files having similar or dissimilar types;
  if needed, transforming each of the output files to standardized output files, the standardized output files having a single format;
  storing the standardized output files to a first storage;
  creating user profiled test execution results for each user utilizing the standardized output files that define requirements of each user; and
  storing the profiled test execution results to a second storage.

13. A computer implemented method as recited in claim 12, wherein the single format of the standardized output files is an XML format.

14. A computer implemented method as recited in claim 12, the method further comprising:
  receiving a request of a specific user to verify the profiled test execution results of the specific user for a particular test case of a given test suite;
  updating the profiled test execution results of the specific user for the particular test case, if updates are made;
  updating the transformed output files of the specific user to reflect the verification of the profiled test execution results of the specific user; and
  displaying the updated and validated profiled test execution results of the specific user.

15. A computer implemented method as recited in claim 12, wherein the single format of the standardized output files is Extensible Markup Language(XML).

16. A computer implemented method as recited in claim 12, wherein the profiled test execution results has an XML format.

17. A computer implemented method as recited in claim 12, wherein the first storage is a storage part of a core layer.

18. A computer implemented method as recited in claim 17, wherein the first storage is an Enterprise Java Beans (EJB).

19. A computer implemented method as recited in claim 12, the method further comprising:
  generating a report using the updated and verified profiled test execution results of the specific user.

20. A computer implemented method as recited in claim 12, wherein the second storage is a result data storage.

* * * * *